United States Patent [19]

Clifton et al.

[11] Patent Number: 4,553,265
[45] Date of Patent: Nov. 12, 1985

[54] MONOLITHIC SINGLE AND DOUBLE SIDEBAND MIXER APPARATUS

[76] Inventors: Brian J. Clifton, 45 Millpond Rd., Sudbury, Mass. 01776; Gary D. Alley, 17 Holton Cir., Londonderry, N.H. 03053

[21] Appl. No.: 559,609

[22] Filed: Dec. 8, 1983

[51] Int. Cl.$^4$ .............................................. H04B 1/26
[52] U.S. Cl. .................................. 455/325; 455/327; 455/328; 455/330
[58] Field of Search ............................... 455/325–328, 455/330, 333

[56] References Cited

U.S. PATENT DOCUMENTS

| | | | |
|---|---|---|---|
| 3,742,335 | 6/1973 | Konishi | 321/69 W |
| 3,916,315 | 10/1975 | Konishi | 325/445 |
| 4,006,425 | 2/1977 | Chang et al. | 329/160 |
| 4,215,313 | 7/1980 | Chang et al. | 455/326 |
| 4,276,655 | 6/1981 | Kraemer et al. | 455/327 |
| 4,411,022 | 10/1983 | Clifton et al. | 455/327 |

OTHER PUBLICATIONS

"High Performance Quasi-Optical GaAs Monolithic Mixer at 110 GHz" by Clifton et al., 2/1981.
"Cooled Low Noise GaAs Monolithic Mixers at 110 GHz" by Clifton et al., 6/1981.
Clifton, Brian J., "Schottky Diode Receivers for Operation in the 100–1000 GHz Region," *The Radio and Electronic Engineer*, vol. 49, No. 718, pp. 333–346, Jul./Aug. 1979.
Clifton et al., "Surface-Oriented Schottky Barrier Diodes for Millimeter and Submillimeter Wave Applications", 1978 International Electron Devices Meeting Digest, IEEE Cat. No. 78 CH1324-3ED, pp. 124–128, Dec. 1978.

*Primary Examiner*—Jin F. Ng

[57] ABSTRACT

A monolithic mixer which is impedance matched to a fundamental waveguide, utilizes a slot coupler and a coplanar transmission line to apply an RF and local oscillator signal to a Schotty-barrier diode. The dielectric substrate is utilized to create a dielectric surface wave resonance which is utilized by centering a slot coupler with respect thereto, to provide a reactive image termination at the upper sideband and thereby enhance single and double sideband mixer operation. The IF signal which is available at the output of the Schottky-barrier diode is filtered by means of an RF bypass capacitor that is located on the dielectric substrate surface.

8 Claims, 4 Drawing Figures

MONOLITHIC SINGLE AND DOUBLE SIDEBAND MIXER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a mixer apparatus and in particular to a monolithic single and double sideband mixer apparatus.

It is well known that a mixer is a device with two or more signal inputs which are usually adjustable, and one common output. The mixer stage in a superheterodyne receiver combines the incoming modulated rf signal with the signal of a local rf oscillator to produce a modulated i-f signal. Crystal diodes are generally used as mixers in radar and other microwave equipment.

Many microwave radar superheterodyne receivers do not employ an RF amplifier. They simply use the crystal-mixer stage as the receiver front end. The noise figure of good crystal-mixer receivers is approximately 7 to 10 db over the range of radar frequencies. This is high compared with low-noise RF amplifiers. However, the noise figure of a crystal mixer is acceptable for many radar applications, especially where simplicity is an important consideration.

The purpose of the mixer portion of the superheterodyne receiver is to convert RF energy to IF energy. A crystal diode with nonlinear resistance characteristic is commonly used as the mixing element. A crystal mixer is broadband when the signal and image frequencies are both terminated in a matched load. The energy impressed in the RF signal channel of a broadband mixer is converted in equal portions to the IF signal and the image. Therefore the theoretical broadband conversion loss can never be less than 3 db. Shortcircuiting or open-circuiting the image termination results in a narrowband mixer. The conversion loss is less in the narrowband than in the broadband mixer.

There is considerable interest in high-performance mixers and receivers for the microwave, millimeter, and submillimeter-wave regions which will also be rugged, reliable, and can be mass produced at low cost. Applications range from radio astronomy to large military imaging systems. Since the packaging of existing high-performance mixers using whisker-contacted Schottky-barrier diodes is quite labor intensive, they are expensive and time consuming to produce. At frequencies above 100 GHz, conventional waveguide mixer circuits become increasingly difficult to make, losses increase rapidly, and circuit elements are located at electrically long distances from the diode leading to large and uncontrolled parasitic elements. Monolithic integration allows circuit elements to be located electrically close to the Schottky diode so that circuit losses are reduced and parasitic elements can be controlled. Moreover, novel coupling and impedance-matching configurations are made possible by using the precision of photolithographically defined circuit elements. A monolithic mixer that is easy to assemble, has the potential for low-cost mass production.

In an application of interest entitled "Monolithic Integrated Circuit Mixer Apparatus" by Brian J. Clifton, Gary D. Alley and Ralph A. Murphy, having Ser. No. 343,034 filed on Jan. 27, 1982 there was described therein a double sideband mixer apparatus which is significantly different from either image enhanced single-sideband mixer or the optimixed double-sideband mixer that is the subject of this application. The mixer which is described in the above application was limited in performance by the effects of an undesirable surface wave resonance that detracted from the mixer's operation. The present invention utilizes a dielectric-induced surface wave resonance to enhance both single and double sideband operation.

SUMMARY OF THE INVENTION

The present invention utilizes a dielectric resonator as a substrate for a monolithic single and double sideband mixer apparatus which uses the thickness and delectric constant of the substrate to establish the dielectric resonance. A slot coupler is coupled to a Schottky-barrier diode to provide the mixer function. An RF signal and a local oscillator signal are received in a waveguide horn and propagated through the dielectric resonator substrate to the slot coupler which applies the input signals through a coplanar transmission line to the Schottky-barrier diode. The IF output signal is taken from the cathode of the diode which is the mixer output.

It is one object of the present invention, therefore, to provide an improved single and double sideband mixer apparatus.

It is another object of the invention to provide an improved monolithic mixer apparatus wherein integrated circuit elements are utilized to eliminate parasitic losses between circuit elements.

It is another object of the invention to provide an improved monolithic mixer apparatus wherein single sideband operation is achieved through a reactive image termination of the upper sideband.

It is still another object of the invention to provide an improved monolithic mixer apparatus wherein double sideband operation is achieved by cancelling undesirable surface wave resonance.

It is yet a further object of the invention to provide an improved monolithic mixer apparatus wherein the dielectric resonator substrate establishes a dielectric resonance which provides reactive termination of the upper sideband image frequency.

It is still another object of the invention to provide an improved integrated circuit mixer apparatus which is economical to produce and utilizes conventional, currently available components that lend themselves to standard mass production manufacturing techniques.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
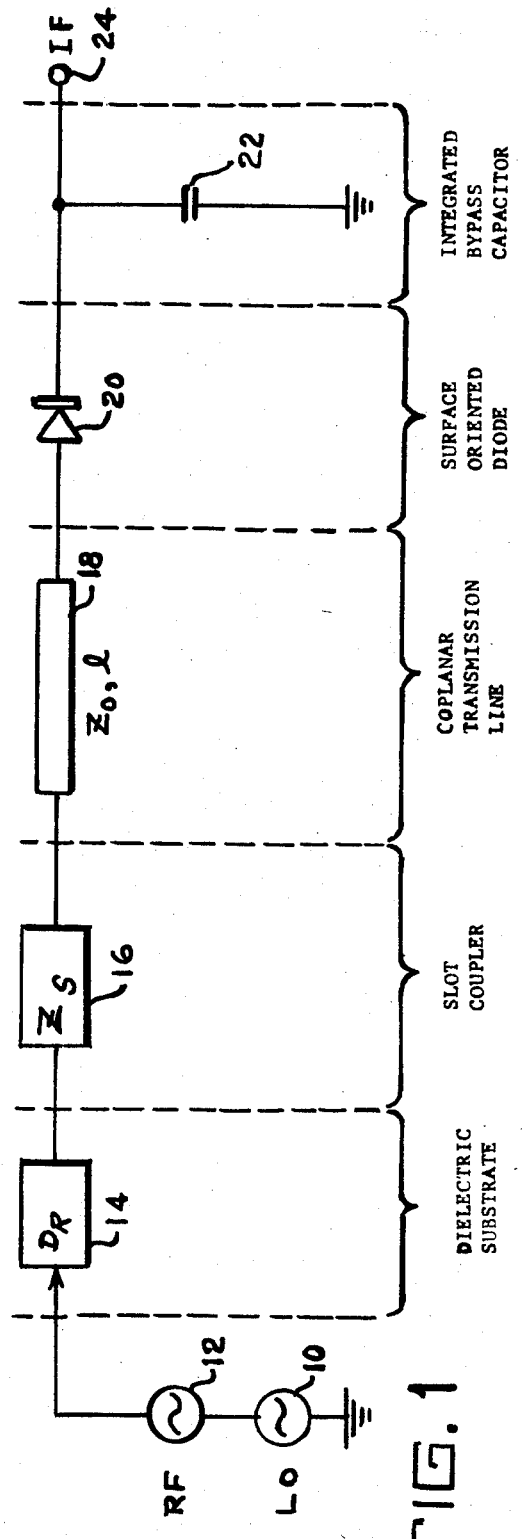
FIG. 1 is a schematic diagram of the monolithic single and double sideband mixer apparatus according to the present invention.

Referring now to FIG. 1, there is shown a schematic diagram of the monolithic mixer apparatus wherein the input signal which comprises an RF and a local oscillator signal are represented respectively by a local oscillator 10 and an RF generator 12. The local oscillator and RF signals are applied to the dielectric resonator which is schematically shown as $D_R$ in block 14. The dielectric resonator 14 comprises a dielectric substrate upon which the mixer elements are fabricated. The dielectric resonator substrate has a rectangular shape of dimension a, b, with a thickness t, and a dielectric constant, $\epsilon_r$. The input signals propagate through the dielectric resonator 14 to a slot coupler unit which is shown schematically as $Z_s$ in block 16. A coplanar transmission line 18 which has a characteristic impedance $Z_o$ and a length, l, applies the input signal to the Schottky-barrier diode 20. The cathode of the Schottky diode 20 is directly connected to the IF output terminal 24. A bypass capacitor 22 which is connected between the IF output terminal 24 and ground, provides a short circuit to millimeter wave frequencies and an open circuit at intermediate frequencies.

Figure 2:
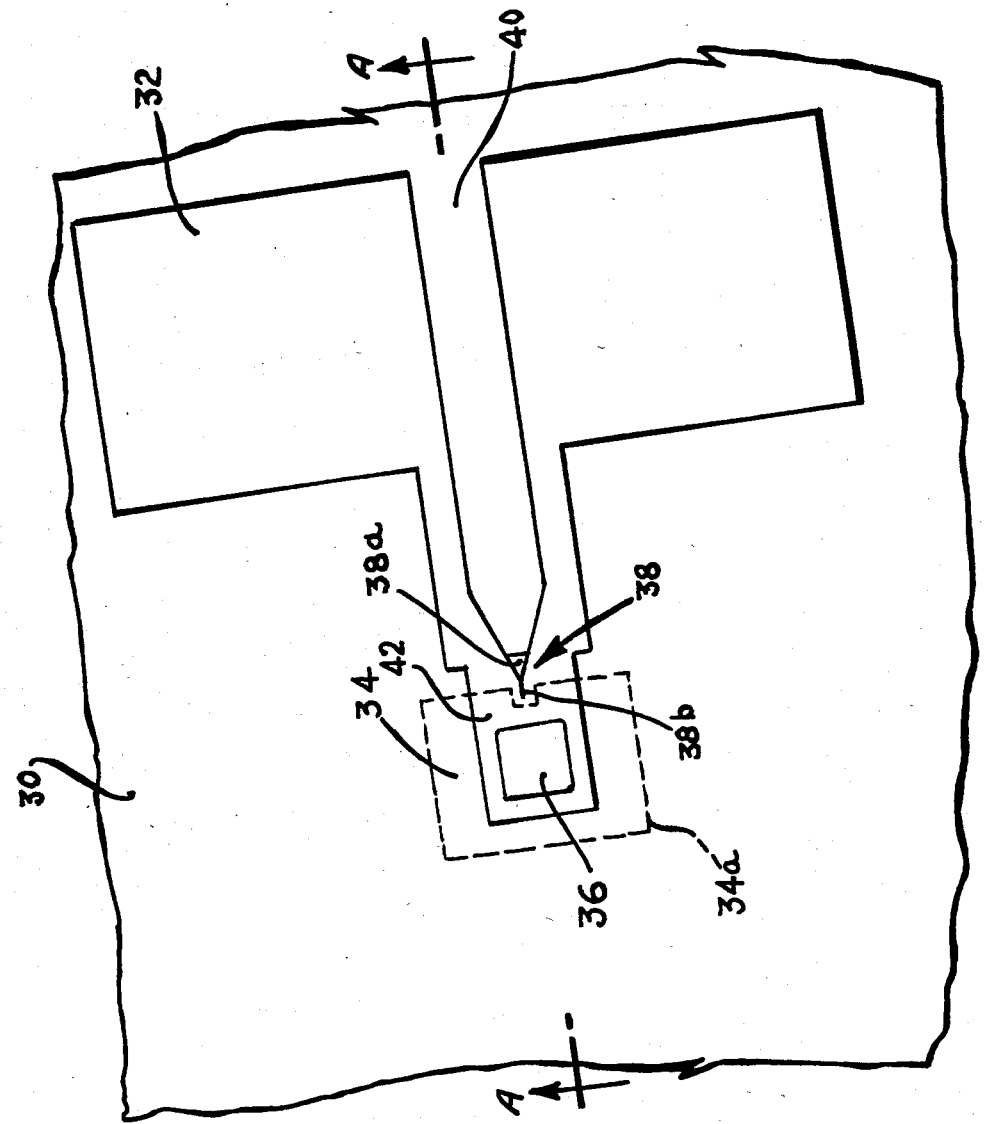
FIG. 2 is a top pictorial view of the monolithic mixer apparatus illustrating the circuit relationship of the mixer elements.

In FIG. 2, there is shown a top pictorial view of the integrated circuit mixer apparatus in which the gold ground plane 30 outlines and defines the slot coupler 32. The peripheral bypass capacitor 34 is defined by the outline of one of the plates that form the capacitor. The bonding pad 36 which is the IF output terminal is positioned adjacent to the cathode 38b of the Schottky diode 38. The coplanar transmission line 40 is connected directly to the anode 38a of the Schottky-barrier diode 38. The coplanar transmission line 40 has a length on the order $0.2\lambda_g$, where $\lambda_g$ is the wavelength of the applied RF signal. The cathode 38b of the Schottky diode is shown extending from the anode 38a and is also defined by the outline of the buried plate of the peripheral bypass capacitor 34. The ohmic contact pad 36 is shown surrounded by the peripheral bypass capacitor 34. The peripheral bypass capacitor 34 is formed by a first capacitor plate 34a which is buried beneath an insulating layer 42 and a second capacitor plate which is defined in the surface ground plane 30 by the first capacitor plate 34a. The insulating layer 42 extends just beyond the periphery of the first capacitor plate 34a and may extend beneath all portions of the surface ground plane 30. The bonding pad 36 is surrounded by the insulating layer 42 and is connected to the portion of first capacitor plate 34a as defined by the shape of bonding pad 36.

The coupling of millimeter-wave radiation into the mixer diode is accomplished by means of the dielectric resonator substrate. In the present mixer apparatus, the input radiation (both the RF and local oscillator signals) propagates through the dielectric substrate wherein a dielectric surface wave resonance is generated to provide a reactive image termination at the upper sideband. The input radiation is coupled to the slot coupler which is formed by the metallic ground plane on the surface of the dielectric substrate. The slot coupler is connected by an appropriate section of coplanar transmission line to a Schottky barrier diode. The Schottky-barrier diode is formed on semiconductor material which has epitaxial layers of n on $n^+$-GaAs located upon a dielectric substrate.

Figure 3:
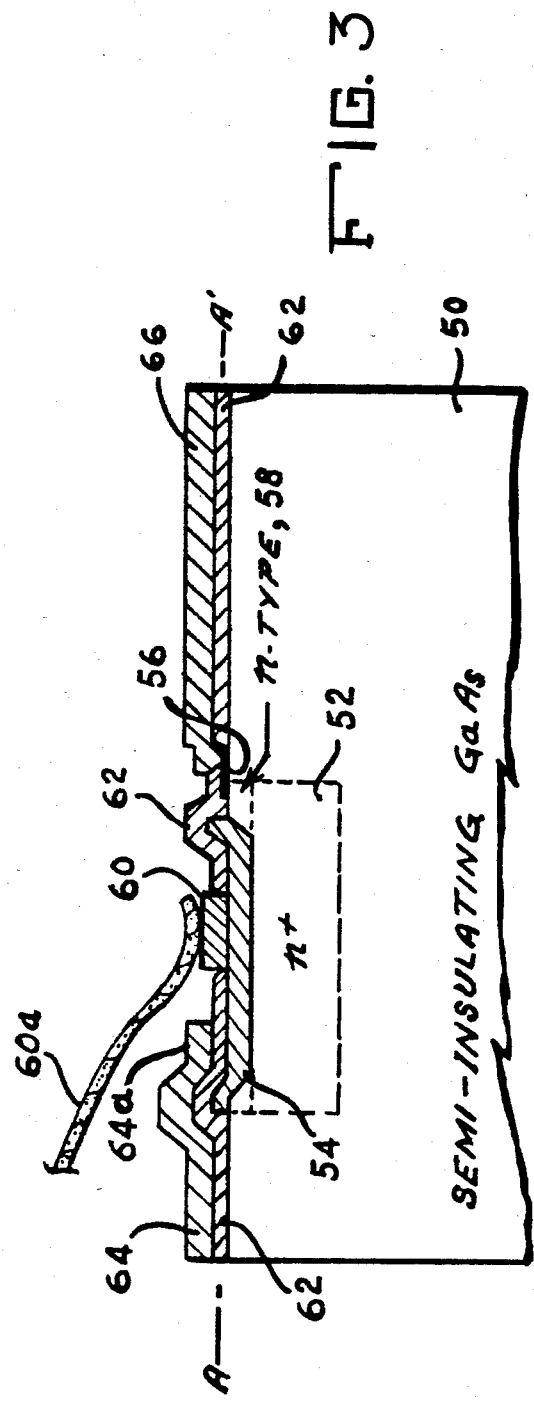
FIG. 3 is a cross-sectional view of the monolithic single and double sideband mixer apparatus taken along line A—A' of FIG. 2.

There is shown in FIG. 3 a cross sectional view taken through the mixer of FIG. 2 along line A—A which indicates the main fabrication and topological details of the mixer apparatus. The semi-insulating substrate 50 may comprise any suitable material such as silicon, gallium arsenide, alumina ceramic, quartz or sapphire. However, in the present example, a substrate of GaAs is provided as a base in which an $n^+$-GaAs layer 52 is grown. A first capacitor plate 54 is formed in electrical contact with the $n^+$-GaAs layer 52. A Schottky-barrier diode 56 is formed on the surface of the semi-insulating substrate 50. A region of n-type material 58 is formed between a portion of the Schottky diode 56 and the $n^+$-GaAs layer 52. A bonding pad 60 is provided on the surface of and in electrical contact with the first capacitor plate 54. A gold ribbon 60a is connected by any suitable conventional means to bonding pad 60. An insulating layer 62 of $SiO_2$ or other suitable dielectric material is deposited over the first capacitor plate 54, and a portion of the Schottky diode 56 and may extend over the substrate 50. A gold ground plane 64 is deposited on the insulating layer 62 and over the substrate 50. The coplanar transmission line 66 is formed in the gold ground plane by photolithographic technique and is in electrical contact with the anode portion of the Schottky diode 56.

The monolithic mixer apparatus is fabricated in the following manner. A semi-insulating GaAs substrate 50 has an $n^+$ layer 52 formed therein. The $n^+$ layer 52 is approximately 3 μm thick with a carrier concentration of $3 \times 10^{18}$ cm$^{313}$ while the n layer 58 is 0.1–0.2 μm thick with a concentration $0.8-2 \times 10^{17}$ cm$^{-3}$. The diode ohmic contact region which is the boundary area between the $n^+$ layer 52 and the first capacitor plate 54, is defined on the surface of the $n^+$-GaAs by etching away the n layer and alloying an evaporated Au-Ge ohmic-contact metallization (first capacitor plate 54) into the $n^+$ layer 52. The Schottky-barrier metallization 56 is a stripe of Ta-Au material which is defined on the surface of the n-GaAs substrate 50 by using optical projection lithography and metallization liftoff. After a layer 62 of $SiO_2$ is deposited over the entire surface and the device areas are protected, proton bombardment is used to isolate the diode conducting area by converting the unprotected epitaxial layers to high-resistivity material. The Schottky-barrier metallization stripe 56 is contacted through an opening in the $SiO_2$ layer with a final overlay circuit metallization that forms the coplanar transmission line 66 and also forms the bypass capacitor (the second capacitor plate 64a) around the periphery of the ohmic contact. The second capacitor plate 64a comprises that portion of the gold ground plane 64 which is defined by the outline (as seen in the top view of FIGS. 2, 3 and labelled 34) of the first capacitor plate 54.

Figure 4:
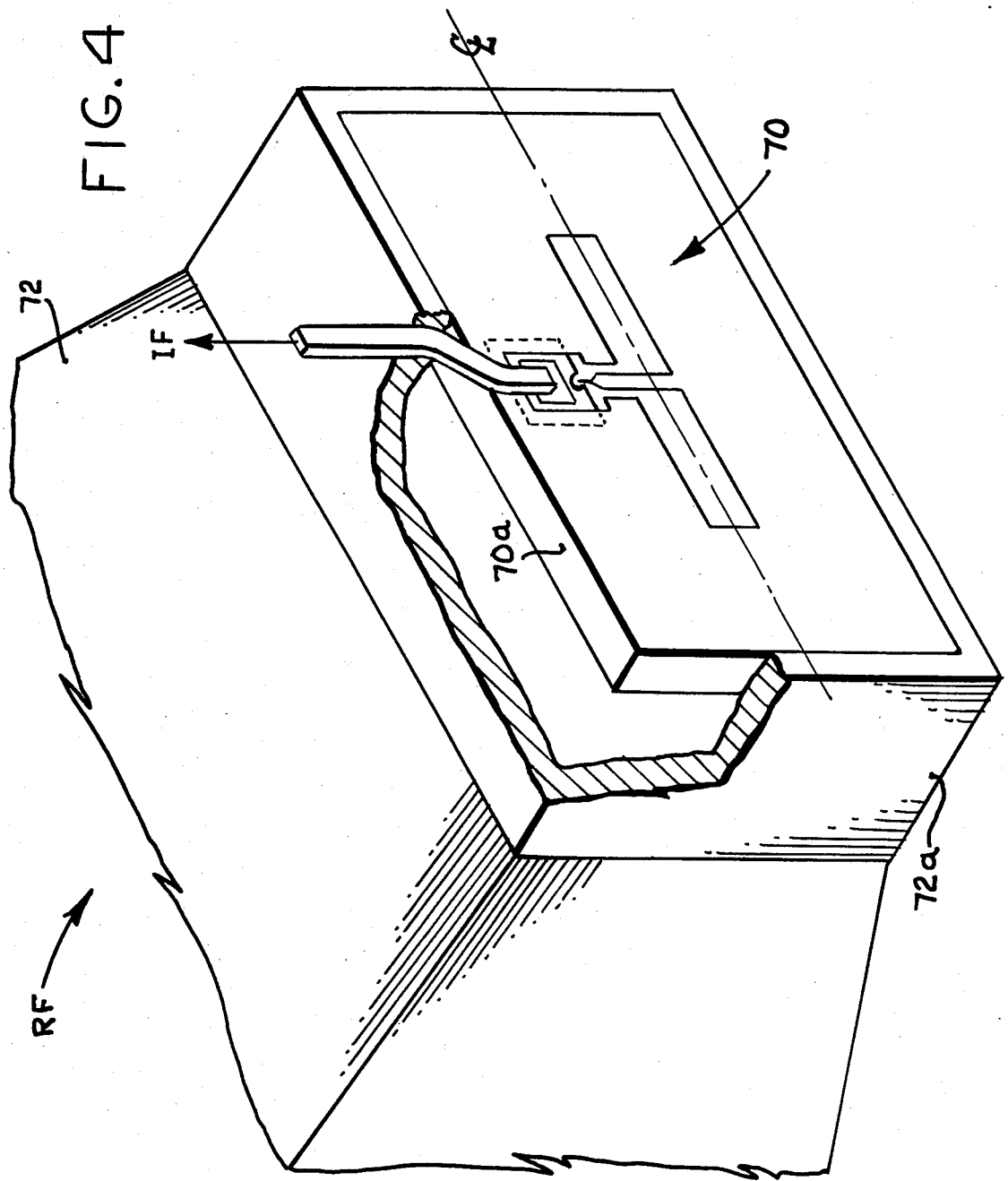
FIG. 4 is a pictorial view, partially in section, of the monolithic mixer apparatus mounted in a waveguide horn.

In FIG. 4, there is shown a mixer module 70 which is mounted in a $TE_{10}$ waveguide horn 72. The module dimensions are chosen to be slightly less than the inside dimensions of $TE_{10}$ waveguide and the module thickness is chosen to establish a dielectric surface wave resonance which will provide a reactive image termination at the upper sideband of the mixer operation. This resonance will occur when the width of the GaAs substrate 70a, which is perpendicular to the E-field in the $Te_{10}$ waveguide 72, is greater than $1.5\lambda_g$ for a TM surface wave propagating on the GaAs surface when it is positioned inside the rectangular metallic guide 72a. By adjusting the position of the slot coupler relative to the center line of the narrow wall of the waveguide, the operation of the mixer can be optimized for single sideband operation. By moving the slot coupler towards the broad wall of the waveguide, the coupling between the slot coupler E-fields and the dielectric surface wave modes can be varied in order to control the impedance which is presented to the semiconductor diode by the image termination. A dielectric surface wave resonance provides a reactive image termination at the upper sideband. In previous mixer circuits, performance was limited by an undesirable surface wave resonances. It is possible to remove the performance limitations in the double sideband mixer by centering the slot in the narrow wall dimension of the waveguide and thus minimize the coupling to this undesired surface wave resonance.

Although the invention has been described with reference to a particular embodiment, it will be understood to those skilled in the art that the invention is capable of a variety of alternative embodiments within the spirit and scope of the appended claims.

What is claimed is:

1. A monolithic mixer apparatus comprising in combination:

a dielectric substrate mounted in a rectangular waveguide having a broad wall and a narrow wall, said dielectric substrate having a top and bottom surface, said dielectric substrate including a ground plane on said top surface, said dielectric substrate having a predetermined length, width, thickness, and dielectric constant, said length being slightly less than the dimension of the broad wall of said rectangular waveguide, said width being slightly less than the dimension of the narrow wall of said waveguide, a slot coupler means formed on the top surface of said dielectric substrate, a coplanar transmission line means disposed on said top surface of said dielectric substrate, said coplanar transmission line means being electrically connected to said slot coupler means, a Schottky-barrier diode located on said top surface of said dielectric substrate, said Schottky-barrier diode having an anode and a cathode, said anode of said Schottky-barrier diode being connected by said coplanar transmission line to said slot coupler means, a bypass capacitor located on said top surface of said dielectric substrate, one plate of said bypass capacitor being electrically connected to the cathode of said Schottky-barrier diode, the other plate of said bypass capacitor being electrically connected to a portion of said ground plane, and, a bonding pad attached to said first capacitor plate to provide an IF signal output terminal, an RF signal and a local oscillator signal being applied to said dielectric substrate, said dielectric substrate establishing a dielectric surface wave resonance upon receipt of said RF signal and said local oscillator signal, said dielectric surface wave resonance propagating within and along the top surface of said dielectric substrate, said RF signal and said local oscillator signal propagating through said dielectric substrate to said slot coupler means, said slot coupler means being adjusted in position with respect to the centerline of the width of said dielectric substrate, said slot coupler means thereby utilizing said dielectric surface wave resonance to provide a reactive image termination at the upper sideband of said RF signal, said slot coupler means coupling said RF signal and said local oscillator signal through said coplanar transmission line means to said Schottky-barrier diode, an IF signal appearing in response to said RF and local oscillator signal at said IF signal output terminal.

2. A monolithic mixer apparatus as described in claim 1 wherein said waveguide comprises a waveguide horn to receive said RF and said local oscillator signal, said dielectric substrate being mounted at one end of said waveguide horn, said bottom surface of said dielectric substrate positioned to receive said RF and said local oscillator signal.

3. A monolithic mixer as described in claim 1 wherein said mixer apparatus operates as a double sideband mixer apparatus by centering said slot coupler means with respect to said width of said dielectric substrate which corresponds to the narrow wall dimension of said waveguide.

4. A monolithic mixer apparatus as described in claim 2 wherein said waveguide horn comprises a $TE_{10}$ waveguide horn.

5. A monolithic mixer apparatus as described in claim 1 wherein said dielectric substrate comprises semi-insulating GaAs.

6. A monolithic mixer apparatus as described in claim 1 wherein said Schottky-barrier diode is surface-oriented and is formed on epitaxial layer of n material on an $n^+$-GaAs layer which is grown on said dielectric substrate.

7. A monolithic mixer apparatus as described in claim 6 wherein said $n^+$ layer is approximately 3 $\mu$m thick with a carrier concentration of $3 \times ^{18}$ cm$^{-3}$ while n layer is 0.1–0.2$\mu$m thick with a concentration $0.8-2 \times 10^{17}$ cm$^{-3}$.

8. A monolithic mixer apparatus as described in claim 1 wherein said coplanar transmission line has a length on the order of $0.2\lambda_g$, where $\lambda_g$ is the wavelength of the applied RF signal.

* * * * *